United States Patent [19]

Clark

[11] 3,786,494

[45] Jan. 15, 1974

[54] ELECTRONIC AUTOMATED SOS DEVICE

[76] Inventor: Fayette M. Clark, 2147 Waynoka Rd., Euclid, Ohio 44117

[22] Filed: Apr. 28, 1972

[21] Appl. No.: 248,723

[52] U.S. Cl. .................... 340/356, 340/353, 328/42

[51] Int. Cl. .................................... G08c 1/00

[58] Field of Search .......................... 340/356, 353; 325/166, 111, 115, 116; 178/79, 82

[56] References Cited

UNITED STATES PATENTS

| | | | |
|---|---|---|---|
| 2,869,116 | 1/1959 | Butterworth | 340/356 |
| 2,993,118 | 7/1961 | Block et al. | 340/356 |
| 3,206,743 | 9/1965 | Nielsen | 340/353 |
| 3,300,582 | 1/1967 | Himes et al. | 178/79 |
| 3,548,407 | 12/1970 | Blackwell | 340/353 |
| 3,596,187 | 7/1971 | Thompson | 178/79 |

*Primary Examiner*—Thomas B. Habecker

[57] ABSTRACT

A system for generating a repetitive SOS code message using binary to binary decimal conversion.

6 Claims, 1 Drawing Figure

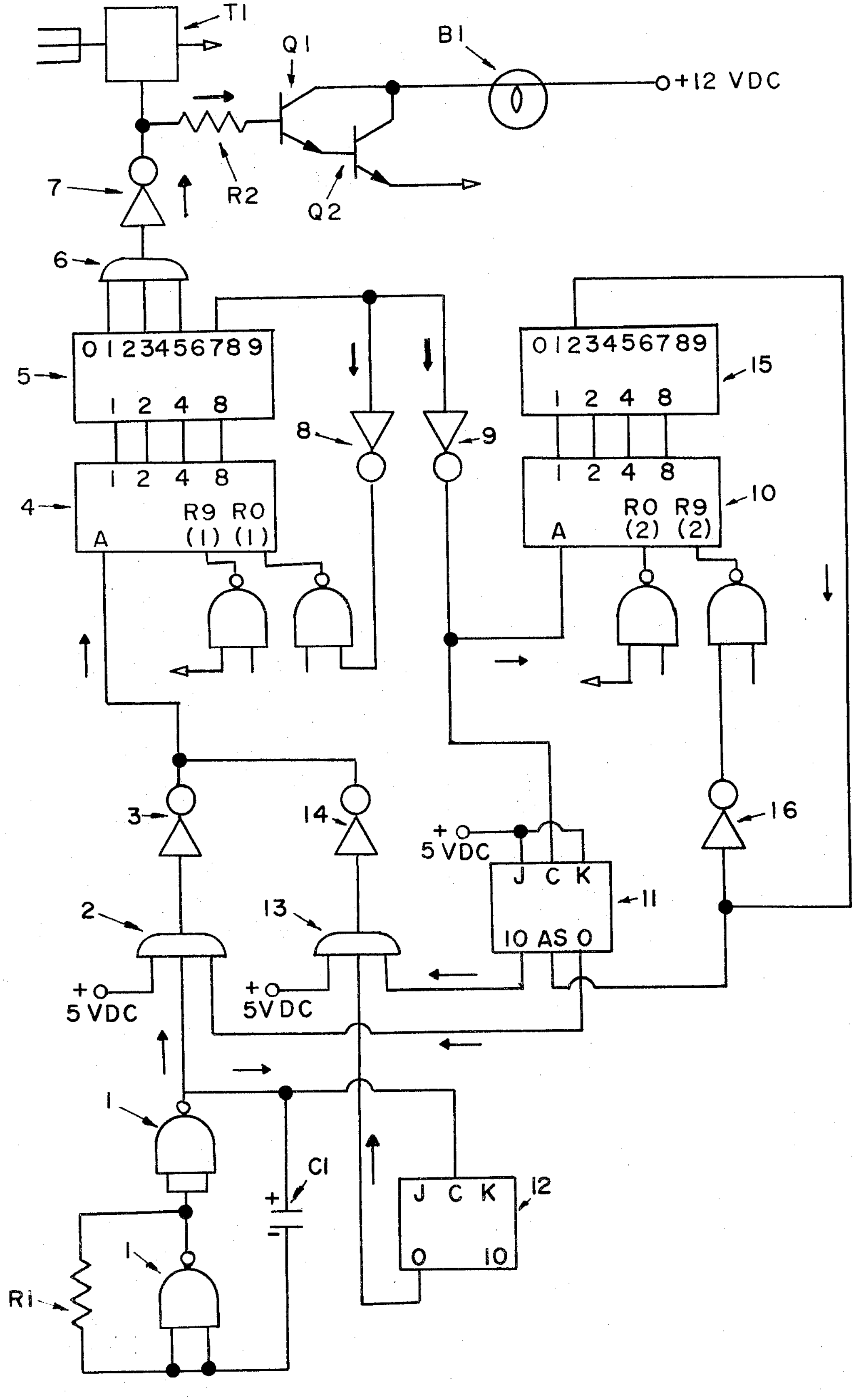
T1
Q1
B1
+12 VDC
R2
Q2
7
6
5
0 1 2 3 4 5 6 7 8 9
1 2 4 8
4
1 2 4 8
R9 R0
(1) (1)
A
8
9
0 1 2 3 4 5 6 7 8 9
15
1 2 4 8
10
1 2 4 8
R0 R9
(2) (2)
A
3
14
+ 5 VDC
J C K
11
10 AS 0
16
2
13
+ 5 VDC
+ 5VDC
1
C1
J C K
12
0 10
1
R1

ELECTRONIC AUTOMATED SOS DEVICE

An object of this invention is to provide electronically the dots and dashes needed to spell SOS.

Another object of this invention is to provide an electronic means to count the dots and dashes needed to spell SOS.

Another object of this invention is to provide an electronic means to change from dots to dashes to dots to complete the code letters SOS.

Another object of this invention is to provide storage of the three cycle SOS in order to electronically repeat the code letters SOS every fourth cycle.

The drawing is a block diagram of an embodiment of this invention.

Gate 1 is a 120 cycle per minute positive going square pulse generator. (Positive Nand Gate)

Gate 2 is a positive pulse dot switch. (Positive And Gate)

Inverter 3 is a negative pulse inverter holding decade 4 input A high between dot pulses.

Decade 4 is a one cycle reset decade counter supplying BCD code to decoder 5.

Decoder 5 is a one cycle 4 to 10 line decoder. All outputs being high except zero at reset and when counting. (4 to 10 Line Decoder)

Gate 6 is a negative pulse three per cycle switch. (Or Gate)

Inverter 7 is a positive pulse inverter holding Q1 and Q2 low between pulses. B1 lights only during the positive going pulse width and at the same time keys the modulation of T1 (a radio frequency transmitter)

Inverter 8 is a positive pulse inverter holding decade 4 input R0 low during each cycle.

Inverter 9 is a positive pulse inverting clock trigger holding decade 10 input A and flip flop 11 input C low between each cycle.

Decade 10 is a three cycle reset decade counter supplying BCD code to decoder 15.

Flip flop 11 is a positive pulse toggle switch. (J-K flip flop)

Flip flop 12 is a positive pulse divider which divides by two. (J-K flip flop)

Gate 13 is a positive pulse dash switch. (Positive And Gate)

Inverter 14 is a negative pulse inverter holding decade 4 input A high between dash pulses.

Decoder 15 is a three cycle 4 to 10 line storage decoder. All outputs are high except 9 at reset and when counting. (4 to 10 line decoder)

Inverter 16 is a positive pulse inverter holding decade 10 input R9 low during the three cycles of SOS. The input pulse to inverter 16 is also used to preset flip flop 11. (AS)

I claim as my invention:

1. A code forming apparatus providing a repetitive code comprising, first pulse generator means for producing pulses with a first repetition rate, second pulse generator means for producing pulses with a second repetition rate, first gate means connected to the output of said first pulse generator means, second gate means connected to the output of said second pulse generator means, enabling means responsive to a reset pulse for alternately enabling both said gate means and responsive to a recycle pulse for enabling said first gate means, code forming means, connected to the output of both said gate means and responsive to the output of an enabled gate means, for producing a predetermined number of code pulses and for producing said reset pulse after said predetermined number of code pulses have been produced, said code pulses having a repetition rate related to the pulse repetition rate appearing at the output of an enabled gate means, and recycle means responsive to said reset pulse for producing said recycle pulse after a predetermined number of said reset pulses have been produced.

2. The apparatus of claim 1 wherein said code forming means comprises a binary to binary coded decimal converter means, a four to ten line decoder means responsive to said converter means, gate means responsive to three preselected outputs of said decoder means, and means responsive to a fourth preselected output of said decoder means for forming a reset pulse.

3. The apparatus of claim 2 wherein said recycle means comprises a binary to binary coded decimal converter means, a four to ten line decoder means, and means responsive to a selected output of said decoder means for forming a recycle pulse.

4. The apparatus of claim 3 wherein said second pulse generator means comprises a dividing means responsive to the output of said first pulse generator means for producing pulses with a repetition rate lower than said first repetition rate.

5. The apparatus of claim 4 wherein said predetermined number of code pulses is three and said predetermined number of reset pulses is three.

6. The apparatus of claim 5 further including a utilization means responsive to the output of said code forming means for providing a visible signal.

* * * * *